April 9, 1957 N. C. FULMER 2,788,471
SHIELDING GROUND STRIP FOR PRINTED CIRCUITS
Filed Sept. 25, 1953
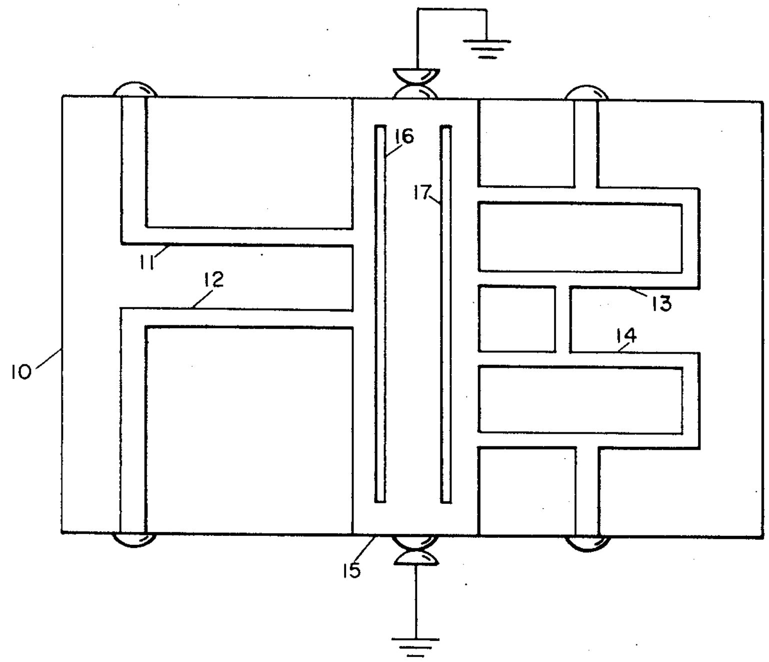
INVENTOR.
NORMAN C. FULMER
BY Darby & Darby
ATTORNEYS

United States Patent Office 2,788,471

Patented Apr. 9, 1957

2,788,471

SHIELDING GROUND STRIP FOR PRINTED CIRCUITS

Norman C. Fulmer, Montclair, N. J., assignor to Allen B. Du Mont Laboratories, Inc., Clifton, N. J., a corporation of Delaware Application September 25, 1953, Serial No. 382,308

3 Claims. (Cl. 317—101)

The present invention relates to a grounding bus bar or strip for a printed circuit and particularly to such a ground strip which additionally serves to shield circuits connected thereto from one another.

The grounding strip of the present invention is applicable in many instances, a typical one of which is the printed circuit panel incorporated in the tuning device of the copending application of Tyminski and Hylas, filed November 19, 1952, Serial No. 321,406.

It is an object of the invention to provide a combined grounding strip and shield for printed circuits.

It is another object of the invention to provide such a grounding strip and shield which requires no major modification of present printed circuits and which may therefore be included in such printed circuits substantially without added cost.

Other objects and features of the invention will be apparent when the following description is considered in connection with the annexed drawing, in which, The single figure of the drawing represents a printed circuit panel embodying oscillator and mixer tuning circuits.

Referring now to the drawing, there is shown at 10 a tuning panel which may be mounted in a rotatable drum so that various panels may be connected to the oscillator and the mixer circuits of a television tuning mechanism, such for example as that shown in the Tyminski and Hylas application above-mentioned.

Printed, stamped or etched upon the insulating panel

10 in usual manners are the oscillator tuning coils 11 and 12 and the mixer tuning coils 13, 14, all these coils being connected at one end thereof to the centrally located grounding bus bar or strip 15. The above-described arrangement provides an excellent tuning device save for the fact that coupling currents circulating in the grounding strip 15 undesirably couple the oscillator and mixer coils.

I have found that by providing one or more longitudinal slits in the grounding strip 15 such as are indicated at 16 and 17 such undesirable coupling currents are eliminated and the oscillator and mixer coils may serve their tuning function without affecting each other.

Preferably, the strip 15 is grounded at both ends as shown in the drawing and includes at least two slits. There will then be no current in the center leg or legs of the strip 15 and the currents in the outer legs and hence the circuits in which those currents flow are isolated from one another. Further, since the center leg or legs has no current flowing therein, there is formed an effective shield between the two tuned circuits.

What is claimed is:

1. An improved grounding strip for a plurality of printed tuning circuits, said strip extending between and being connected to elements of said circuits and said strip having a plurality of longitudinally extending elongated apertures therein to isolate said tuning circuits from each other and to minimize any coupling between said tuning circuits.

2. A device as claimed in claim 1, characterized in that said grounding strip is connected to ground at each end thereof.

3. A grounding strip as claimed in claim 1, characterized in that said elongated apertures are in the form of slits and extend for substantially the full length of said grounding strip.

References Cited in the file of this patent

UNITED STATES PATENTS 2,628,996 Mayo ---------------- Feb. 17, 1953

FOREIGN PATENTS 390,500 Great Britain ------------ Apr. 3, 1933